US005994638A

United States Patent [19]

Edelson

[11] Patent Number: 5,994,638

[45] Date of Patent: Nov. 30, 1999

[54] METHOD AND APPARATUS FOR THERMIONIC GENERATOR

[75] Inventor: Jonathan Sidney Edelson, Hillsboro, Oreg.

[73] Assignee: Borealis Technical Limited, London, United Kingdom

[21] Appl. No.: 08/790,753

[22] Filed: Jan. 27, 1997

Related U.S. Application Data

[63] Continuation-in-part of application No. 08/770,674, Dec. 20, 1996, abandoned.

[51] Int. Cl.$^{6}$ .......... H01L 35/30

[52] U.S. Cl. .......... 136/205; 310/306; 322/2 R

[58] Field of Search .......... 136/200, 201, 136/202, 205; 310/301, 302, 305, 3.6; 322/2 R

[56] References Cited

U.S. PATENT DOCUMENTS

| | | | |
|---|---|---|---|
| 2,915,652 | 12/1959 | Hatsopoulos et al. | 310/4 |
| 3,021,472 | 2/1962 | Hernqvist | 322/2 R |
| 3,118,107 | 1/1964 | Gabor | 322/2 R |
| 3,173,032 | 3/1965 | Maynard | 310/4 |
| 3,238,395 | 3/1966 | Sense | 310/4 |
| 3,239,745 | 3/1966 | Hernqvist | 322/2 R |
| 3,267,307 | 8/1966 | Fox | 310/4 |
| 3,267,308 | 8/1966 | Hernqvist | 310/4 |
| 3,281,372 | 10/1966 | Haas | 252/301.1 |
| 3,328,611 | 6/1967 | Davis | 310/4 |
| 3,376,437 | 4/1968 | Meyerand et al. | 310/4 |
| 3,393,330 | 7/1968 | Vary | 310/4 |
| 3,470,393 | 9/1969 | Moncorge | 310/4 |
| 3,515,908 | 6/1970 | Caldwell | 310/4 |
| 3,519,854 | 7/1970 | Davis | 310/4 |
| 3,578,992 | 5/1971 | Paine | 310/4 |
| 3,983,423 | 9/1976 | Rasor et al. | 310/4 R |
| 4,292,579 | 9/1981 | Constant | 322/2 R |
| 4,303,845 | 12/1981 | Davis | 310/306 |
| 4,667,126 | 5/1987 | Fitzpatrick | 310/306 |
| 4,755,350 | 7/1988 | Kennel | 376/321 |
| 5,028,835 | 7/1991 | Fitzpatrick | 313/14 |
| 5,156,688 | 10/1992 | Buhler et al. | 136/211 |
| 5,492,570 | 2/1996 | Horner-Richardson et al. | 136/200 |
| 5,578,886 | 11/1996 | Holmlid et al. | 310/306 |
| 5,598,052 | 1/1997 | Khan et al. | 313/310 |

*Primary Examiner*—Kathryn Gorgos
*Assistant Examiner*—Thomas H. Parsons

[57] ABSTRACT

An improved thermionic generator constructed using microenginerring techniques is described. This device is easy to construct in large numbers, efficient, and inexpensive. A preferred embodiment uses micromachined silicon to produce a thermionic converter cell. These may be joined together in large arrays to form a thermionic generator.

44 Claims, 7 Drawing Sheets

(a)

(b)

(c)

Fig. 7A
Fig. 7B
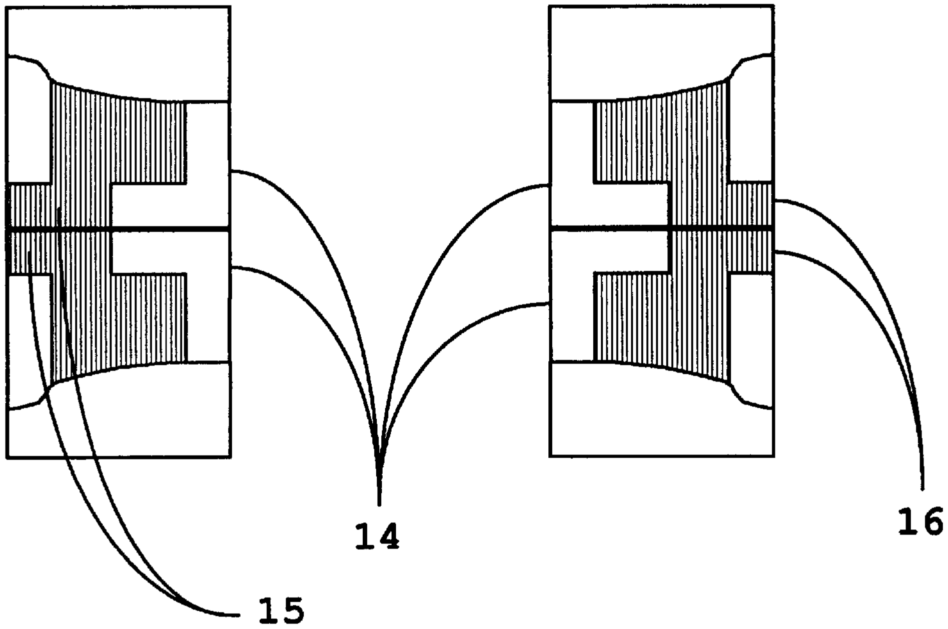
Fig. 7C
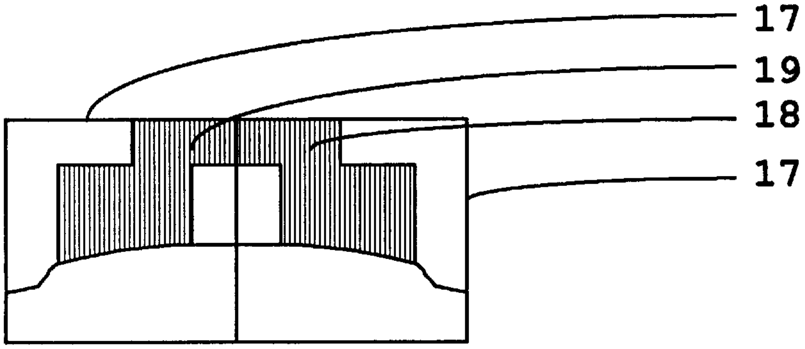
Fig. 7D
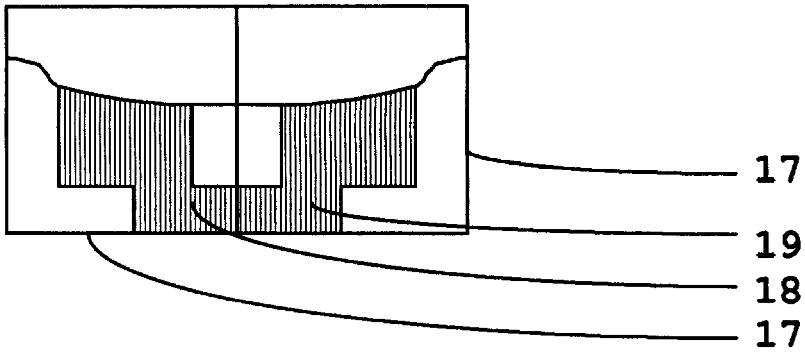

METHOD AND APPARATUS FOR THERMIONIC GENERATOR

BACKGROUND: CROSS REFERENCE TO RELATED APPLICATIONS

This application is a Continuation-in-Part of the application titled "Method and Apparatus for Thermionic Generator" Ser. No. 08/770,674, filed Dec. 20, 1996 now abandoned. The present application is further related to pending application titled "Method and Apparatus for Vacuum Diode Heat Pump" Ser. No. 08/498,199, filed Jul. 5, 1995.

BACKGROUND: FIELD OF INVENTION

The present invention is related to thermionic generators, and in particular to thermionic generators fabricated using micromachining methods.

BACKGROUND: ELECTRICITY GENERATION

Most electricity is generated at a power station by a process in which heat is used to convert water to steam. The steam expands through a turbine device causing it to rotate. This powers a generator unit, which produces electricity. The heat is provided by burning a fuel such as coal, oil, gas, or wood, or from nuclear, solar or geothermal energy.

On a smaller scale, the generator unit may be powered by an internal combustion engine, such as a diesel or petrol driven motor. Similarly, the alternator used with the internal combustion engine in every type of automobile for providing electricity to the vehicle is powered by the rotating drive shaft of the engine.

All these devices use moving parts which are subject to friction and wear, and only a percentage of the heat generated is converted into electricity.

BACKGROUND: THERMIONIC GENERATORS

The thermionic generator, a device for converting heat energy to electrical energy, was first proposed by Schlieter in 1915. This device depends on emission of electrons from a heated cathode. In a thermionic generator, the electrons received at the anode flow back to the cathode through an external load, effectively converting the heat energy from the cathode into electrical energy at the anode. Voltages produced are low, but Hatsopoulos (U.S. Pat. No. 2,915,652) has described a means of amplifying this output.

One of the problems associated with the design of thermionic converters is the space-charge effect, which is caused by the electrons as they leave the cathode. The emitted electrons have a negative charge which deters the movement of other electrons towards the anode. Theoretically the formation of the space-charge potential barrier may be prevented in at least two ways: the spacing between the electrodes may be reduced to the order of microns, or positive ions may be introduced into the cloud of electrons in front of the cathode.

In practice, however, difficulties remain. Thus Maynard (U.S. Pat. No. 3,173,032) describes a close spaced vacuum converter utilizing uniform, finely divided insulating particles disposed randomly between emitter and collector surfaces to effect a very close spacing. This and other designs have proven unsatisfactory for large-scale operation due to the extremely close tolerances required. Fitzpatrick (U.S. Pat. No. 4,667,126) teaches that "maintenance of such small spacing with high temperatures and heat fluxes is a difficult if not impossible technical challenge".

The use of positive ions to reduce space charge is also not without problems. Although cesium and auxiliary discharge thermionic converters have been described, they do not have high efficiency, are costly to fabricate, and, particularly in the high-pressure ignited mode, do not have a long life. The technique of introducing a cesium plasma into the electrode space brings with it further disadvantages. These include heat exchange reactions within the plasma during the operation of the device, and the reactivity of the plasma, which can damage the electrodes.

In low pressure, non-ignited mode, high temperatures are required to ionize the cesium atoms. For operation at lower temperatures, Moncorge (U.S. Pat. No. 3,470,393) and Rasor (U.S. Pat. No. 3,983,423) disclose approaches using an auxiliary discharge to supply the ionized gas, and Hernquist (U.S. Pat. No. 3,021,472) describes a device where the heat source is also applied to a third electrode to raise it to a sufficient temperature that contact ionization will occur. Hernquist has also (U.S. Pat. No. 3,239,745) developed a further three-electrode device in which the ionized gas is maintained following an initial pre-ionization step. Although these four devices operate at a lower temperature than prior low pressure, non-ignited mode devices, they do not provide a high efficiency of energy conversion. Davis (U.S. Pat. No. 3,328,611) describes another approach for eliminating space-charge. He describes a central spherical emitter surrounded by a vacuum and a concentric collector. The collector is in contact with but electrically insulated from a chargeable control member which is operated at up to 10 million volts. This creates an electrostatic field which eliminates the space charge effect. Davis describes two further devices in U.S. Pat. Nos. 3,519,854 and 4,303,845 which overcome space charge effects by having alternative means of withdrawing power from the thermionic converter. The first uses a Hall-effect collector and the second withdraws power by generating an induced emf as electrons traverse an induction coil. Gabor (U.S. Pat. No. 3,118,107) describes an AC magnetron version of the thermionic generator. Again these devices do not permit low temperature, high efficiency operation, and additionally are of complex construction.

Another problem associated with the operation of thermionic converters is loss of heat from the hot emitter to the cooler collector. Various designs have been described to minimize this. Caldwell (U.S. Pat. No. 3,515,908) describes insulating spacers between the electrodes and between the electrodes and the envelope. Sense (U.S. Pat. No. 3,238,395) discloses an emitter which has in its body one or more cavities having electron emitting walls. These are completely enclosed except for one or more restricted passages leading to the external emission surface. A large proportion of the electrons emitted will exit through the passages. Heat radiated by the cavity walls, however, is largely reabsorbed by the opposite walls. Thus higher electron fluxes are obtained without an increased loss of heat. A magnetically channeled plasma diode heat converter having a heat shield between the emitter and collector electrodes is described by Fox (U.S. Pat. No. 3,267,307). Two inventors describe the use of thermally transparent collectors: Meyerand (U.S. Pat. No. 3,376,437) and Fitzpatrick (U.S. Pat. No. 5,028,835).

Improvements to the design of thermionic converters have also focused on the development of better electrodes. Thus Paine (U.S. Pat. No. 3,578,992) describes an emitter surface which has a number of inwardly defined cavities whose depth are comparable to the electro-neutral mean-free path. The diameters of the cavities are chosen to prevent electron space charge from occurring at the open ends of these cavities. This emitter has a cesiated work function which is considerably lower than a flat or non-cavity emitter. Consequently it may be operated at lower temperatures. Holmlid (U.S. Pat. No. 5,578,886) also describes a very low work function electrode which is coated with a carbon-like material.

When planar electrodes are used in the high-pressure, low-temperature ignited mode, the plasma does not always form uniformly between the electrodes; Hernquist (U.S. Pat. No. 3,267,308) discloses an electrode geometry which overcomes this problem.

Vary (U.S. Pat. No. 3,393,330) describes a pair of comb-like collector elements having intermeshed segments defining alternately narrow and wide spaces. Electrons reaching the collector flow in opposite directions in adjacent segments to produce a magnetic field which aids electron flow from emitter to collector.

Despite these attempts to develop improved thermionic converters for electricity generation, applications have been limited to those where the use of steam production and turbine generators is inconvenient, such as nuclear power plants for satellites. For example, Hass (U.S. Pat. No. 3,281,372) describes an emitter comprised of a matrix of a fissionable material such as uranium oxide carbide and a thermionic material. When exposed to a neutron flux, the fissionable material becomes hot and causes electrons to boil off the thermionic material.

Although thermionic devices can show efficiencies of up to 20% for the energy conversion, these are for experimental, not production, devices. This is not high when compared to conventional means for generating electricity. However, an inexpensive, mass-produced, reliable device having an extended life would have many advantageous applications. Heat sources such as solar energy, which is a renewable resource, could be used. Additionally, heat energy which would otherwise be a wasted side-effect of an industrial process could be partially and usefully recycled using such devices.

There remains a need, therefore, for a thermionic generator which is easy to fabricate, inexpensive, reliable, of high efficiency and having an extended life. From the foregoing it is clear that gas-filled thermionic converters having wide-spaced electrodes do not fulfill this need.

For example, the alternator of the automobile could be replaced by a thermionic generator using the heat contained in the exhaust gases as a source of energy, which would lead to an increase in the efficiency of the engine.

Another application is in domestic and industrial heating systems. These need a pump to circulate heated water around the system, which requires a source of power. The control circuitry regulating the temperature of the building being heated also requires power. These could both be supplied by means of a thermionic generator powered by the hot flue gases.

A further application utilizes heat generated by solar radiation. This could either be in space or earth-based solar power stations, or on the roof of buildings to supply or augment the power requirements of the building.

The current invention addresses problems associated with the construction of the close-spaced thermionic generator by applying design approaches, such as MicroElectronicMechanicalSytems (MEMS) and MEMCad, and microengineering techniques, which have not previously been applied to this field.

BACKGROUND: MICROENGINEERING

Microengineering refers to the technologies and practice of making three dimensional structures and devices with dimensions in the order of micrometers or smaller. The two constructional technologies of microengineering are microelectronics and micromachining.

Microelectronics, producing electronic circuitry on silicon chips, is a well developed technology. Micromachining is the technique used to produce structures and moving parts for microengineered devices. One of the main goals of microengineering is to be able to integrate microelectronic circuitry into micromachined structures, to produce completely integrated systems. Such systems could have the same advantages of low cost, reliability and small size as silicon chips produced in the microelectronics industry. Silicon micromachining techniques, used to shape silicon wafers and to pattern thin films deposited on silicon wafers, are well-known. Common film materials include silicon dioxide (oxide), silicon nitride (nitride), polycrystalline silicon (polysilicon or poly), and aluminum. They can be patterned using photolithographic and well-known wet etching techniques. Other materials, including noble metals such as gold, can also be deposited as thin films and are often patterned by a method known as "lift off".

Dry etching techniques, which are more amenable to automation, are also used. The most common form is reactive ion etching. Ions are accelerated towards the material to be etched, and the etching reaction is enhanced in the direction of travel of the ion. Deep trenches and pits (up to ten or a few tens of microns) of arbitrary shape and with vertical walls can be etched in a variety of materials including silicon, oxide and nitride. Another approach is to use the electrochemical passivation technique. A wafer with a particular impurity concentration is used, and different impurities are diffused, or implanted, into the wafer. This is done to form a diode junction at the boundary between the differently doped areas of silicon. The junction will delineate the structure to be produced. An electrical potential is then applied across the diode junction, and the wafer is immersed in a suitable wet etch. This is done in such a way that when the etch reaches the junction an oxide layer (passivation layer) is formed which protects the silicon from further etching.

Combinations of the above techniques may be used for surface micromachining to build up the structures in layers of thin films on the surface of the silicon wafer. This approach typically employs films of two different materials, a structural material (commonly polysilicon) and a sacrificial material (oxide). These are deposited and dry etched in sequence. Finally the sacrificial material is wet etched away to release the structure. Structures made by this approach include cantilever beam, chambers, tweezers, and gear trains.

Larger more complex devices can also be formed by bonding micromachined silicon wafers together, or to other substrates. One approach is anodic bonding. The silicon wafer and glass substrate are brought together and heated to a high temperature. A large electric field is applied across the join, which causes an extremely strong bond to form between the two materials. Other bonding methods include using an adhesive layer, such as a glass or photoresist. While anodic bonding and direct silicon bonding form very strong joins, they suffer from some disadvantages, including the requirement that the surfaces to be joined are very flat and clean.

An alternative to using photolithographic and wet etching techniques is the use of excimer laser micromachining. These lasers produce relatively wide beams of ultraviolet laser light. One interesting application of these lasers is their use in micromachining organic materials (plastics, polymers, etc.). The absorption of a UV laser pulse of high energy causes ablation, which removes material without burning or vaporizing it, so the material adjacent to the area machined is not melted or distorted by the heating. The shape of the structures produced is controlled by using a chrome on quartz mask, and the amount of material removed is dependent on the material itself, the length of the pulse, and the intensity of the laser light. Relatively deep cuts of hundreds of microns deep can be made using the excimer laser. Structures with vertical or tapered sides can also be created.

A further approach is LIGA (Lithographie, Galvanoformung, Abformung). LIGA uses lithography, electroplating, and molding processes to produce microstructures. It is capable of creating very finely defined microstructures of up to 1000 μm high. The process uses X-ray lithography to produce patterns in very thick layers of photoresist and the pattern formed is electroplated with metal. The metal structures produced can be the final product, however it is common to produce a metal mold. This mold can then be filled with a suitable material, such as a plastic, to make the finished product in that material. The X-rays are produced from a synchrotron source, which makes LIGA expensive. Alternatives include high voltage electron beam lithography which can be used to produce structures of the order of 100 μm high, and excimer lasers capable of producing structures of up to several hundred microns high.

These techniques are coupled with computer-aided design and manufacture in MicroElectroMechanical Systems, or MEMS. This enabling technology includes applications such as accelerometers, pressure, chemical and flow sensors, micro-optics, optical scanners, and fluid pumps, all of which are integrated micro devices or systems combining electrical and mechanical components. They are fabricated using integrated circuit batch processing techniques and can range in size from micrometers to millimeters. These systems can sense, control and actuate on the micro scale, and function individually or in arrays to generate effects on the macro scale.

Production of Thermionic Generators using micromachining techniques is not found in the art. Using MEMS to facilitate the design and production of these devices is also not found in the art.

BRIEF DESCRIPTION OF THE INVENTION

The present invention discloses a Thermionic Generator having close spaced electrodes and constructed using microengineering techniques.

The present invention further utilizes, in one embodiment, the technique known as MicroElectroMechanical Systems, or MEMS, to construct a Thermionic Generator.

The present invention further utilizes, in another embodiment, microengineering techniques to construct a Thermionic Generator by wafer bonding.

The present invention further utilizes, in another embodiment, the technique known as MicroElectroMechanical Systems, or MEMS, to construct a Thermionic Generator by wafer bonding.

OBJECTS AND ADVANTAGES

An object of the present invention is to provide a Thermionic Generator constructed using micromachining techniques.

An advantage of the present invention is that said Thermionic Generator may be constructed easily in an automated, reliable and consistent fashion.

An advantage of the present invention is that said Thermionic Generator may be manufactured inexpensively.

An advantage of the present invention is that said Thermionic Generator may be manufactured in large quantities.

An advantage of the present invention is that electricity may be generated without any moving parts.

Another object of the present invention is to provide a Thermionic Generator in which the electrodes are close-spaced.

An advantage of the present invention is that said Thermionic Generator has reduced space-charge effects.

An advantage of the present invention is that said Thermionic Generator may operate at high current densities.

Another object of the present invention is to provide a Thermionic Generator using new electrodes having a low work function.

An advantage of the present invention is that electricity may be generated from heat sources of 1000K or less.

An advantage of the present invention is that waste heat may be recovered.

Another object of the present invention is to provide a Thermionic Generator which produces electricity at lower temperatures than those known to the art.

An advantage of the present invention is that a variety of heat sources may be used.

An advantage of the present invention is that electricity may be generated where needed rather than at a large power station.

An advantage of the present invention is that electricity may be generated using nuclear power, geothermal energy, solar energy, energy from burning fossil fuels, wood, waste or any other combustible material.

Another object of the present invention is to provide a Thermionic Generator which can replace the alternator used in vehicles powered by internal combustion engines.

An advantage of the present invention is that the efficiency of the engine is increased.

Another object of the present invention is to provide a Thermionic Generator which has no moving parts.

An advantage of the present invention is that maintenance costs are reduced.

DESCRIPTION OF DRAWINGS

FIGS. 7(*a–d*) illustrates two embodiments of the joining of the thermionic device of the present invention to form an array of cells.

DESCRIPTION OF INVENTION

The following description describes a preferred embodiment of the invention and should not be taken as limiting the invention. Other embodiments obvious to those skilled in the art are included in the present invention.

Figure 1:
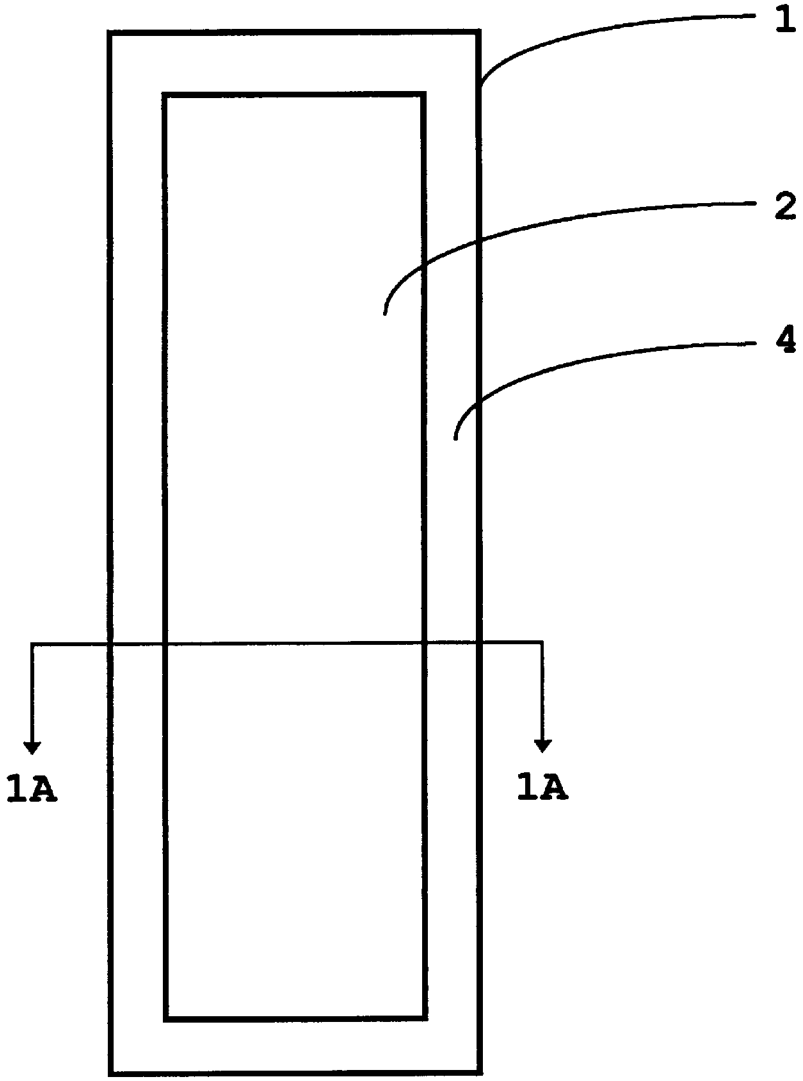
FIGS. 1, 1A, 2, 2A, 3, 3A, 4, 4A, 5*a*, 5*b*, and 5*c* illustrate, with like numerals referring to the same elements, illustrates a single embodiment of the present invention and show in a schematic fashion the fabrication of a thermionic device which uses a combination of silicon micromachining and wafer bonding techniques.
Figure 1A:
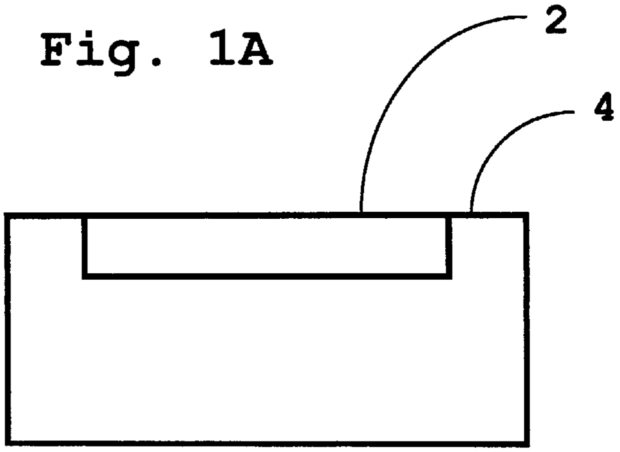
Figure 2:
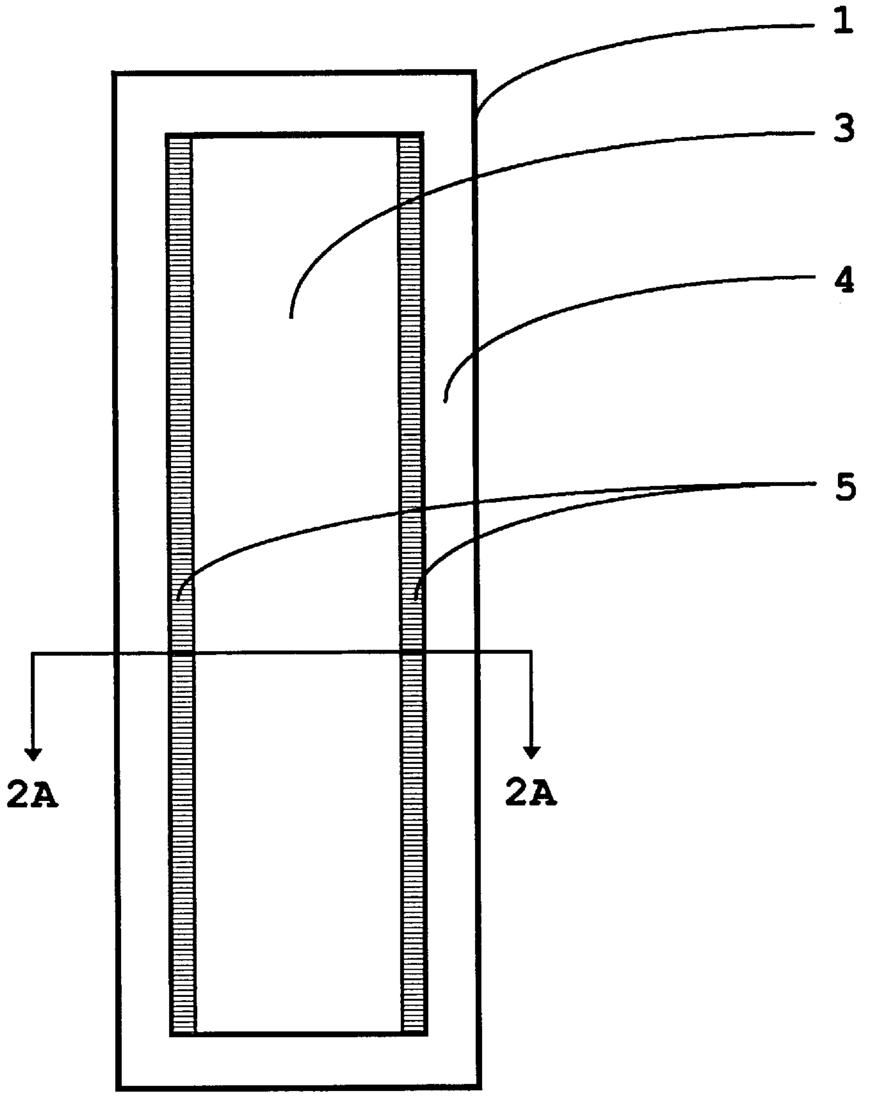
Figure 2A:
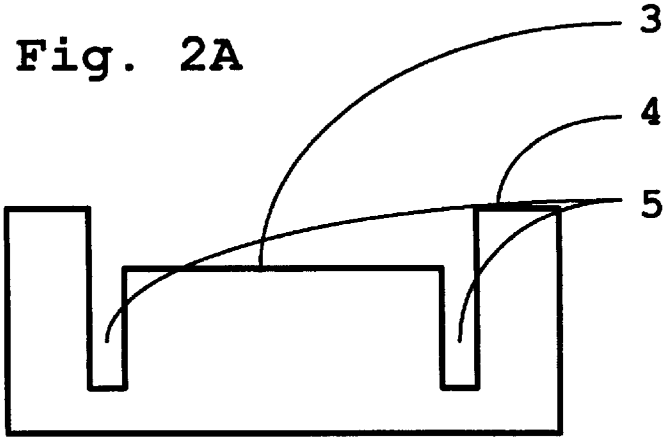

Referring to FIG. 1, a silicon wafer 1 is oxidized to produce an oxide layer 2 about 0.5 $\mu$m deep on part of its surface. Oxide layer 2 covers a long thin region in the center of wafer 1, surrounded by an edge region 4. The wafer is treated to dissolve the oxide layer, leaving a depression 3 on the surface of the wafer which is about 0.5 $\mu$m deep (FIG. 2), surrounded by edge region 4. Two parallel saw cuts, 5, are made into the wafer along two opposing edges of the depression (FIG. 2).

Figure 3:
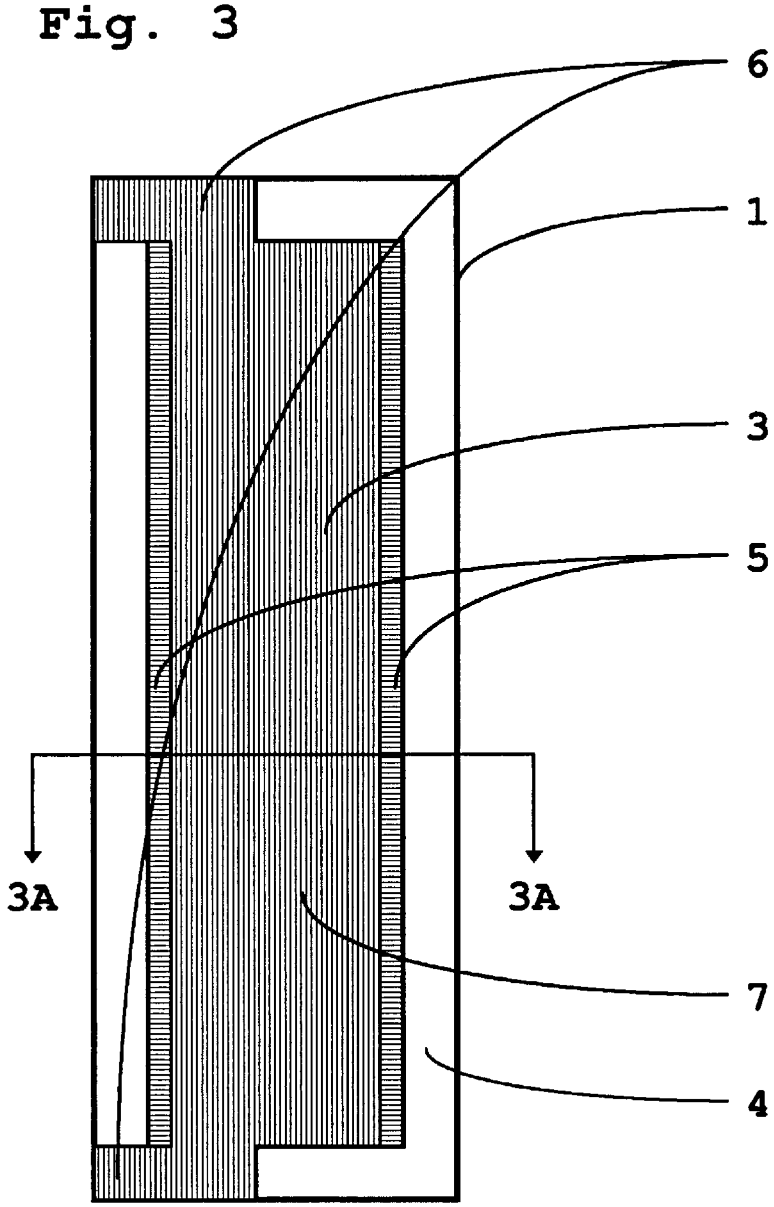
Figure 3A:
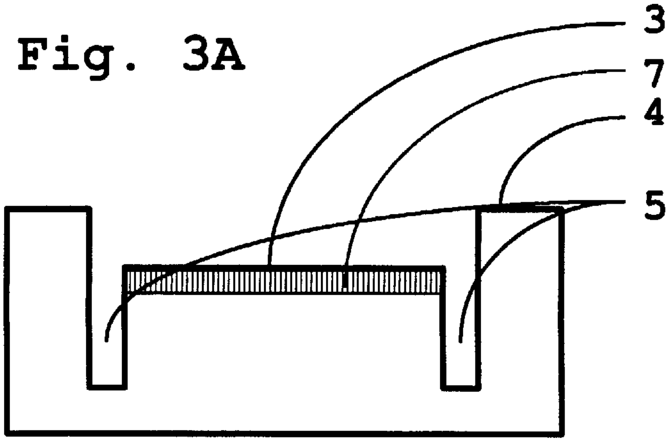

The next stage involves the formation of means for electrical connection (FIG. 3). The floor of depression 3, and two tabs 6 on edge region 4 of wafer 1 at right angles to saw cuts 5 are doped for conductivity to form a doped region 7.

Figure 4:
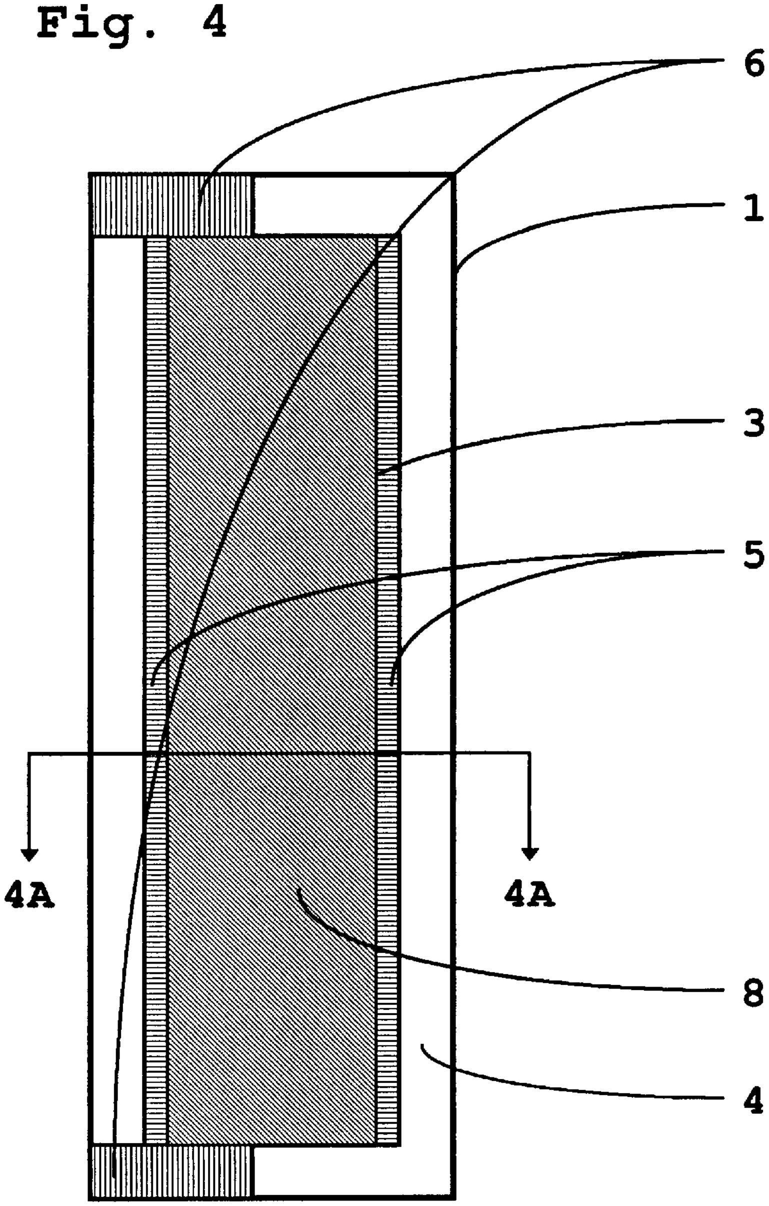
Figure 4A:
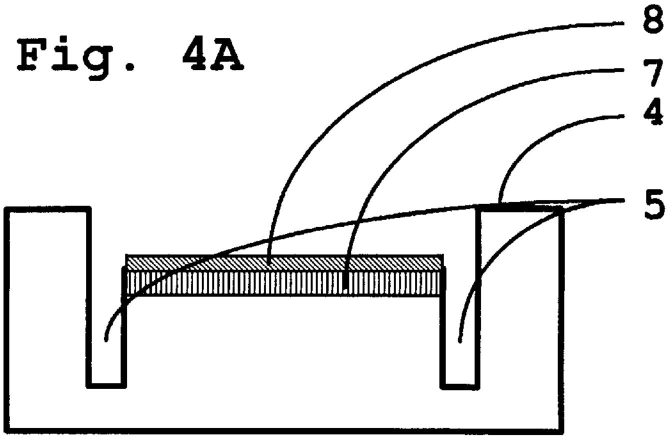

A coating 8 is formed by depositing material, preferably silver, on a surface of depression 3, preferably by vacuum deposition, using low pressure and a non-contact mask to keep edge regions 4 clean (FIG. 4). A second wafer is treated in like manner.

Figure 5:
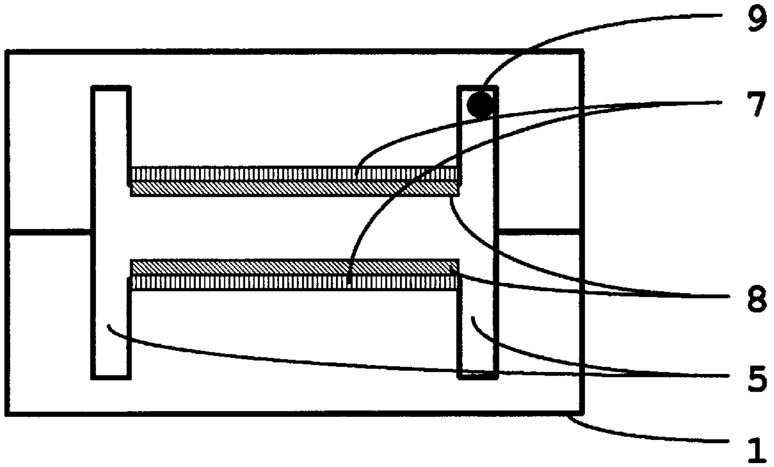
Figure 5:
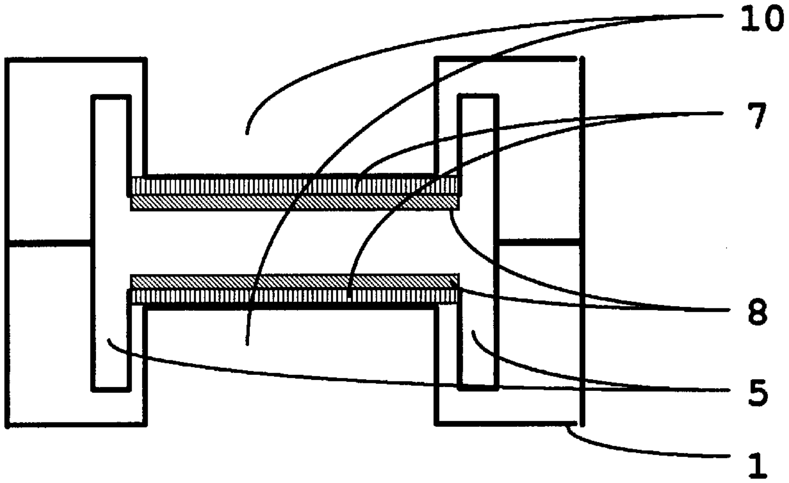
Figure 5:
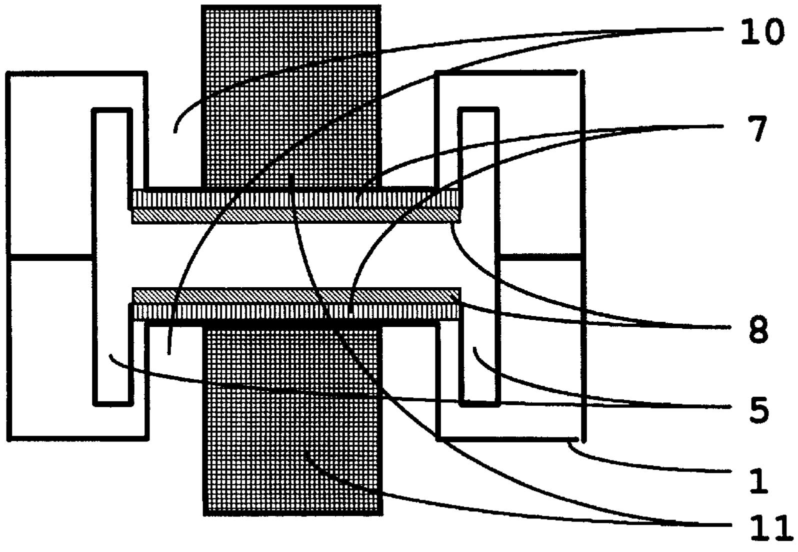

Referring now to FIG. 5, an amount of cesium 9 is placed in one of cut channels 5 of one of the wafers. Both wafers are flushed with oxygen and joined together so that edge region 4 of both wafers touch. The structure is then annealed at 1000° C., which fuses the wafers together and vaporizes the cesium (FIG. 5*a*). The oxygen oxidizes the preferred silver coating to give a silver oxide surface, and the cesium cesiates the silver oxide surface. This forms two electrodes. These steps also serve to form a vacuum in the gap between the wafers.

Further saw cuts, 10, are made in the back of the joined wafers (see FIG. 5*b*) and the center of the space which is formed is filled with solder 11. (see FIG. 5*c*). The device is annealed to attach the solder and remove stress.

This micromachining approach provides a thermionic converter cell. A number of these may be joined together such that by overlapping doped tabs 3 (FIG. 7), there will be electrical conductivity from the doped region of one cell to the doped region of an adjacent cell. Thus FIGS. 7A and 7B show how thermionic converter cells 14 of the present invention may be joined end to end: the lower tab of one cell 15 is in electrical contact with the lower tab of the adjacent cell 15 (FIG. 7A), and the upper tabs 16 are similarly in electrical contact (FIG. 7B). FIGS. 7C and 7D show how thermionic converter cells 17 of the present invention may be joined side to side: the lower tab 18 of one cell is in contact with the upper tab 19 of the adjacent cell. Several such cells may be fabricated upon a single substrate, thereby producing a lower current, higher voltage device.

Figure 6:
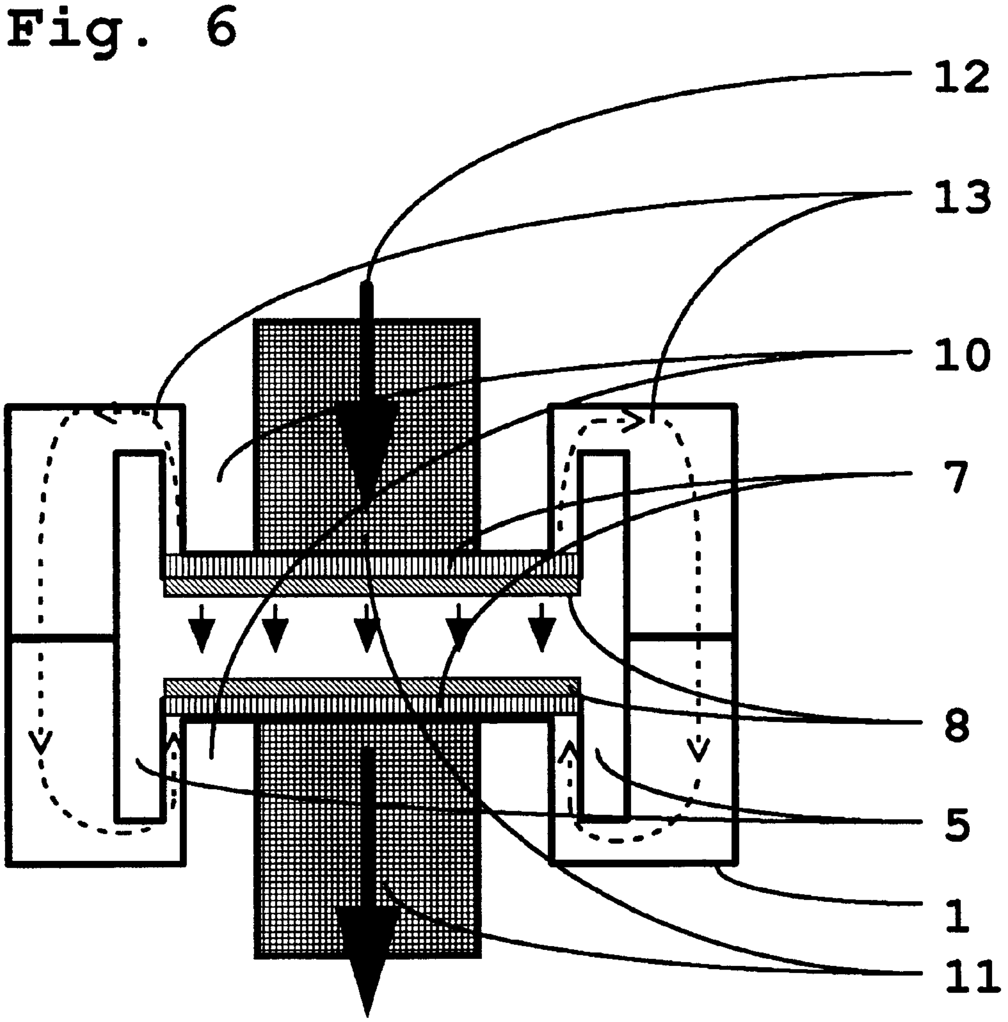
FIG. 6 illustrates the heat flows in one embodiment of the thermionic device of the present invention.

Referring now to FIG. 6, solder bars 11 provide thermal contact between the heat source and the cathode, or emitter, and between the heat sink and the anode, or collector.

Saw cuts 5 are provided to achieve thermal insulation between the hot side of the device and the cold side. The desired heat conduction pathway is along solder bar 11 to the cathode, or emitter electrode, across the gap (as thermionically emitted electrons) to the anode, or collector electrode, along the other solder bar 11 to the heat sink. Undesirable heat conduction occur as heat is conducted along silicon wafer 1 away from solder bar 11, around saw cut 5, across the fused junction between the wafers, and around the saw cut 5 in the other wafer. This pathway for the conduction of heat is longer than the desired heat conduction pathway via the electrodes, and as silicon is a poor conducter of heat, heat losses are thereby minimized.

In another preferred embodiment, silicon wafer 1 is mounted on a thermal insulating material. When saw cuts 5 are made, these cut through the silicon wafer and into the thermal insulating material. This produces a device in which undesirable heat conduction through the device is reduced: as heat is conducted along the silicon wafer away from solder bars 11 and around saw cut 5, it has to pass through a thermal insulator region.

The foregoing describes a single thermionic converter formed by micromachining techniques from a pair of fused wafers. In another preferred embodiment, more than one thermionic converter "cell" is formed from each pair of wafers. In this embodiment (FIGS. 7C and 7D) the tabs 18 and 19 of adjoining cells touch so that each anode of one cell is connected to the cathode of an adjacent cell, forming a series circuit.

In other preferred embodiments, electrode coating 8 may be provided by other thermionic materials, including but not limited to cesium, molybdenum, nickel, platinum, tungsten, cesiated tungsten, bariated tungsten, thoriated tungsten, the rare earth oxides (such as barium and strontium oxides), and carbonaceous materials (such as diamond or sapphire). In addition, the electrode coating 8 may be an alkali metal, an alloy of alkali metals, or an alloy of alkali metal and other metals, an alkaline earth metal, a lanthanide metal, an actinide metal, alloys thereof, or alloys with other metals, which is coated with a complexing ligand to form an electride material. The complexing ligand may be 18-Crown-6, also known by the IUPAC name 1,4,7,10,13,16-hexaoxacyclooctadecane, 15-Crown-5, also known by the IUPAC name 1,4,7,10,13-pentoxacyclopentadecane, Cryptand [2,2,2], also known by the IUPAC name 4,7,13,16,21,24-hexoxa-1,10-diazabicyclo [8,8,8] hexacosane or hexamethyl hexacyclen. Electride materials are of benefit in this application because of their low work functions.

SUMMARY, RAMIFICATION, AND SCOPE

The essence of the present invention is the use of micromachining techniques to provide thermionic converter cells having close-spaced electrodes.

Specific electrode materials have been described, however other materials may be considered.

Although the above specification contains many specificities, these should not be construed as limiting the scope of the invention but as merely providing illustrations of some of the presently preferred embodiments of this invention.

Thus the scope of the invention should be determined by the appended claims and their legal equivalents, rather than by the examples given.

I claim:

1. A thermionic converter comprising:

a) a micromachined first substrate having on one face a shallow depression of substantially uniform depth coated with a thermionic emissive material and surrounded by an edge region which is thermally resistive, said thermionic emissive material in electrical contact with electrical contact means, said thermionic emissive material in thermal contact with thermal contact means, joined by said edge region to b) an edge region surrounding a shallow depression of substantially uniform depth on one face of a micromachined second substrate, said depression coated with a thermionic emissive material and surrounded by an edge region which is thermally resistive, said thermionic emissive material in electrical contact with electrical contact means, said thermionic emissive material in thermal contact with thermal contact means, said thermionic missive material of said first substrate being separated by a gap from said thermionic emissive material of said second substrate.

2. The thermionic converter of claim 1 in which said substrate material is a silicon wafer.

3. The thermionic converter of claim 1 in which said shallow depression of said first and said second substrate is introduced by a micromachining process comprising the steps of:

a) forming an oxide layer on the surface of said first and second substrates by oxidation means b) dissolving said oxide layer by dissolution means.

4. The thermionic converter of claim 1 in which said electrical contact means on said first and said second substrate is produced via doping means for the modification of electrical properties of said substrate.

5. The thermionic converter of claim 1 in which said coating of said thermionic emissive material on said first and said second substrate is introduced by vacuum deposition of said thermionic emissive material by vacuum deposition means.

6. The thermionic converter of claim 1 in which said first substrate and said second substrate are joined by contacting said edge regions of said first substrate and said second substrate and fusing them by heating means.

7. The thermionic converter of claim 1 in which said thermal contact means on said first and said second substrate is produced by:

a) removing substrate material by sawing means to form a channel b) filling center of said channel with solder.

8. The thermionic converter of claim 1 in which said edge regions of said micromachined first and second substrate each have a deep channel cut along two opposing sides of said depression, whereby the thermal path between said joined first and second substrates is increased.

9. The thermionic converter of claim 1 in which said gap between said thermionic emissive material of said first and second substrate is substantially evacuated.

10. The thermionic converter of claim 9 in which said substantially evacuated gap is formed by a micromachining process comprising the steps:

a) contacting said edge regions of said first substrate and said second substrate, b) purging said gap with oxygen, c) fusing said first substrate and said second substrate by heating, d) allowing said oxygen to react with said thermionic emissive material, whereby said oxygen is substantially depleted and said substantially evacuated gap is formed.

11. The thermionic converter of claim 1 in which said gap between said thermionic emissive material of said first and second substrate contains cesium vapor.

12. A thermionic electricity generator comprising at least two thermionic converters of claim 1 electrically and thermally connected together to form an array.

13. A thermionic converter fabricated by micromachining techniques having one or more electrodes, wherein said one or more electrodes has on one face a shallow depression of substantially uniform depth, wherein said depression is coated by a thermionic material.

14. The thermionic converter of claim 13 wherein said electrodes are separated by a space, wherein said space is substantially evacuated.

15. The thermionic converter of claim 13 wherein said electrodes are separated by a space, wherein said space comprises cesium vapor.

16. The thermionic converter of claim 13 in which said thermionic material is selected from the group consisting of cesium, molybdenum, nickel, platinum, tungsten, cesiated silver oxide, cesiated tungsten, bariated tungsten, thoriated tungsten, and rare earth oxides.

17. The thermionic converter of claim 13 in which said thermionic material is selected from the group consisting of carbonaceous material, diamond and sapphire.

18. The thermionic converter of claim 13 in which said thermionic material is selected from the group consisting of alkali metal, alloy of alkali metals, alloy of alkali metal and other metals, alkaline earth metal, lanthanide metal, actinide metal.

19. The thermionic converter of claim 13 in which said thermionic material is an electride.

20. A thermionic electricity generator comprising at least two thermionic converters of claim 13 electrically and thermally connected together to form an array.

21. A thermionic converter fabricated by micromachining techniques having one or more electrodes, wherein said one or more electrodes has on one face a shallow depression of substantially uniform depth, wherein said depression is surrounded by an edge region, said edge region having a deep channel cut along two opposing sides of said depression.

22. The thermionic converter of claim 21 having one or more electrodes separated by a space, wherein said space is substantially evacuated.

23. The thermionic converter of claim 21 having one or more electrodes separated by a space, wherein said space comprises cesium vapor.

24. The thermionic converter of claim 21 in which said thermionic material is selected from the group consisting of cesium, molybdenum, nickel, platinum, tungsten, cesiated silver oxide, cesiated tungsten, bariated tungsten, thoriated tungsten, and rare earth oxides.

25. The thermionic converter of claim 21 in which said thermionic material is selected from the group consisting of carbonaceous material, diamond and sapphire.

26. The thermionic converter of claim 21 in which said thermionic material is selected from the group consisting of alkali metal, alloy of alkali metals, alloy of alkali metal and other metals, alkaline earth metal, lanthanide metal, actinide metal.

27. The thermionic converter of claim 21 in which said thermionic material is an electride.

28. A thermionic electricity generator comprising at least two thermionic converters of claim 21 electrically and thermally connected together to form an array.

29. A thermionic converter comprising one or more electrodes, wherein said one or more electrodes has on one face a shallow depression of substantially uniform depth, wherein said depression is coated by a thermionic material.

30. The thermionic converter of claim 29 wherein said electrodes are separated by a space, wherein said space is substantially evacuated.

31. The thermionic converter of claim 29 wherein said electrodes are separated by a space, wherein said space comprises cesium vapor.

32. The thermionic converter of claim 29 in which said thermionic material is selected from the group consisting of cesium, molybdenum, nickel, platinum, tungsten, cesiated silver oxide, cesiated tungsten, bariated tungsten, thoriated tungsten, and rare earth oxides.

33. The thermionic converter of claim 29 in which said thermionic material is selected from the group consisting of carbonaceous material, diamond and sapphire.

34. The thermionic converter of claim 29 in which said thermionic material is selected from the group consisting of alkali metal, alloy of alkali metals, alloy of alkali metal and other metals, alkaline earth metal, lanthanide metal, actinide metal.

35. The thermionic converter of claim 29 in which said thermionic material is an electride.

36. A thermionic electricity generator comprising at least two thermionic converters of claim 29 electrically and thermally connected together to form an array.

37. A thermionic converter comprising one or more electrodes, wherein said one or more electrodes has on one face a shallow depression of substantially uniform depth, wherein said depression is surrounded by an edge region, said edge region having a deep channel cut along two opposing sides of said depression.

38. The thermionic converter of claim 37 wherein said electrodes are separated by a space, wherein said space is substantially evacuated.

39. The thermionic converter of claim 37 wherein said electrodes are separated by a space, wherein said space comprises cesium vapor.

40. The thermionic converter of claim 37 in which said thermionic material is selected from the group consisting of cesium, molybdenum, nickel, platinum, tungsten, cesiated silver oxide, cesiated tungsten, bariated tungsten, thoriated tungsten, and rare earth oxides.

41. The thermionic converter of claim 37 in which said thermionic material is selected from the group consisting of carbonaceous material, diamond and sapphire.

42. The thermionic converter of claim 37 in which said thermionic material is selected from the group consisting of alkali metal, alloy of alkali metals, alloy of alkali metal and other metals, alkaline earth metal, lanthanide metal, actinide metal.

43. The thermionic converter of claim 37 in which said thermionic material is an electride.

44. A thermionic electricity generator comprising at least two thermionic converters of claim 37 electrically and thermally connected together to form an array.

* * * * *